(12) United States Patent
Light et al.

(10) Patent No.: US 9,213,239 B2
(45) Date of Patent: Dec. 15, 2015

(54) METHODS OF FORMING PATTERNS FOR SEMICONDUCTOR DEVICE STRUCTURES

(71) Applicants: Scott Light, Boise, ID (US); Yuan He, Boise, ID (US); Michael A. Many, Merdian, ID (US); Michael Hyatt, Boise, ID (US)

(72) Inventors: Scott Light, Boise, ID (US); Yuan He, Boise, ID (US); Michael A. Many, Merdian, ID (US); Michael Hyatt, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 13/746,543

(22) Filed: Jan. 22, 2013

(65) Prior Publication Data

US 2014/0205952 A1    Jul. 24, 2014

(51) Int. Cl.
*G03F 7/22* (2006.01)
*G03F 7/20* (2006.01)

(52) U.S. Cl.
CPC .................................. *G03F 7/2022* (2013.01)

(58) Field of Classification Search
USPC .................................................. 430/328, 394
See application file for complete search history.

(56) References Cited

U.S. PATENT DOCUMENTS

| 5,858,620 | A  | 1/1999  | Ishibashi et al. |
| 6,905,975 | B2 | 6/2005  | Boettiger et al. |
| 6,916,594 | B2 | 7/2005  | Bok et al. |
| 7,151,040 | B2 | 12/2006 | Tran et al. |
| 7,202,174 | B1 | 4/2007  | Jung et al. |
| 7,378,727 | B2 | 5/2008  | Caspary et al. |
| 7,713,818 | B2 | 5/2010  | Chan |
| 7,851,135 | B2 | 12/2010 | Jung et al. |
| 7,862,988 | B2 | 1/2011  | Koh et al. |
| 8,207,576 | B2 | 6/2012  | Tran et al. |
| 2007/0238299 | A1 | 10/2007 | Niroomand et al. |
| 2008/0292991 | A1 | 11/2008 | Wallow et al. |
| 2010/0130016 | A1 | 5/2010  | DeVilliers |
| 2010/0239983 | A1 | 9/2010  | Sills et al. |
| 2011/0297646 | A1 | 12/2011 | deVillers et al. |

FOREIGN PATENT DOCUMENTS

WO    2011151243 A1    12/2011

*Primary Examiner* — Daborah Chacko Davis
(74) *Attorney, Agent, or Firm* — TraskBritt (57) ABSTRACT

Methods of forming a pattern in a semiconductor device structure include deprotecting an outer portion of a first photosensitive resist material, forming a second photosensitive resist material, exposing portions of the first and second photosensitive resist materials to radiation, and removing the deprotected outer portion of the first photosensitive resist material and the exposed portions of the first and second photosensitive resist materials. Additional methods include forming a first resist material over a substrate to include a first portion and a relatively thicker second portion, deprotecting substantially the entire first portion and an outer portion of the second portion while leaving an inner portion of the second portion protected, and forming a second resist material over the substrate. A portion of the second resist material is exposed to radiation, and deprotected and exposed portions of the first and second resist materials are removed.

25 Claims, 8 Drawing Sheets

METHODS OF FORMING PATTERNS FOR SEMICONDUCTOR DEVICE STRUCTURES

FIELD

Embodiments of the present disclosure relate to methods of semiconductor processing, such as forming a two-dimensional pattern of at least one material to define at least one structure for a semiconductor device.

BACKGROUND

As semiconductor device features are reduced in size, conventional processing techniques (e.g., photolithography) are unable to directly meet the size requirements. The concept of pitch can be used to describe the sizes of features of a semiconductor device. Pitch may be defined as a distance between an identical point in two adjacent features when the pattern includes repeating features, as in arrays. These features are conventionally separated by spaces between adjacent features, which spaces are subsequently filled by a material, such as an insulator. As a result, pitch can be viewed as the sum of the width of a feature and of the width of the space on one side of the feature separating that feature from the adjacent feature. However, due to factors such as optics and radiation wavelength, photolithography techniques have a minimum pitch below which a particular photolithographic technique cannot reliably form features. Thus, the minimum pitch of a photolithographic technique is an obstacle to continued feature size reduction.

"Pitch doubling" or "pitch multiplication" is a technique that may be used to form features smaller than is possible by conventional photolithography technology. While pitch is actually reduced by this technique, the reduction in pitch is conventionally referred to as "pitch doubling" or, more generally, "pitch multiplication." Thus, conventionally, "multiplication" of pitch by a certain factor actually involves reducing the pitch by that factor. The conventional terminology is retained herein.

In one method of pitch doubling, a feature is formed by conventional photolithography and a spacer is formed on sidewalls of the feature. Material from the spacer is removed from horizontal surfaces (e.g., a top of the feature, a floor of a space between adjacent features), leaving the spacers only along the sidewalls of the feature. The feature is removed, leaving two spacers for every one feature originally formed by photolithography (e.g., one spacer on each of two opposing sidewalls of the feature). The spacers form a pattern, which is transferred into an underlying material. Material underlying the spacers is retained, while material underlying an area between the spacers is removed to faint features under each spacer in a desired pattern. Alternatively or additionally, material may be formed (e.g., deposited) between the spacers, between features underlying the spacers, or within gaps and trenches formed under the spacers. Thus, a number of features can essentially be doubled in a given area, compared to conventional photolithography techniques.

If a metal pattern is formed by disposing a metal material within gaps and trenches formed under the spacers, the metal material may be subjected to an abrasive removal process (e.g., chemical-mechanical polishing (CMP)) to remove excess metal material. Such a process may cause so-called "dishing" in larger metal features, such as metal pads, in which central portions of the larger metal features are thinner than peripheral portions thereof. Dishing can lead to reliability issues and even failures of devices incorporating structures resulting from such a process.

Pitch doubling techniques involve an undesirable number of process acts to arrive at a final pattern. Alternative, improved methods for fabricating features of dimensions below resolution limits of photolithography are desirable.

BRIEF DESCRIPTION OF THE DRAWINGS

FIGS. 1A through 8B illustrate a method of forming a pattern in a semiconductor device structure according to an embodiment of the present disclosure.

FIGS. 9 through 12 illustrate a method of forming a pattern in a semiconductor device structure according to another embodiment of the present disclosure.

DETAILED DESCRIPTION

As used herein, the term "substantially" in reference to a given parameter means and includes to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

As used herein, any relational term, such as "first," "second," "over," "on," "underlying," etc., is used for clarity and convenience in understanding the disclosure and accompanying drawings and does not connote or depend on any specific preference, orientation, or order, except where the context clearly indicates otherwise.

As used herein, the phrase "semiconductor device structure" means and includes any structure (e.g., wafer, die, substrate) of any shape and size that includes intermediate or finished materials or structures used in forming a semiconductor device, such as a memory device, an imaging device, a light emitting diode (LED) device, a processor device, a logic device, a micro-electromechanical system (MEMS) device, etc. In some embodiments, a semiconductor device structure of the present disclosure may or may not include any semiconductor material, and may include non-semiconductor materials (e.g., a metal material, a polymer material, a resist material, a ceramic material, etc.) used in forming a semiconductor device.

As used herein, the term "deprotect" and related terms mean and include a process in which a material protected from a chemical reaction or dissolution by a solvent, such as a developer solution, is chemically modified to become reactive or soluble in the solvent. The chemical modification may include a chemical reaction with at least one functional group bonded to the material. The terms "chemically deprotect" and "deprotect" may be used interchangeably herein.

Although the terms "soluble" and "insoluble" are used herein for simplicity, these terms may be equated with "more soluble" and "less soluble," respectively. Accordingly, a material that is "insoluble" in a solution may, in reality, be slightly soluble in the solution, while a material that is "soluble" in the solution may be soluble in the solution to a higher degree than the insoluble material. Thus, as used herein, the terms "soluble" and "insoluble" are relative and not absolute terms.

The following description provides specific details, such as material types and processing conditions, in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below may not foam a complete process flow for manufacturing semiconductor devices. The structures described below do not form complete semiconductor devices. Only those process acts and structures necessary to understand embodiments of the present disclosure are described in detail below. Additional acts to form complete semiconductor devices and systems may be performed by conventional fabrication techniques. Accordingly, only the methods and semiconductor device structures necessary to understand embodiments of the present disclosure are described herein.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, process, and compositional changes may be made without departing from the scope of the disclosure. The illustrations presented herein are not meant to be actual views of any particular system, device, structure, or memory cell, but are merely idealized representations that are employed to describe the embodiments of the present disclosure. The drawings presented herein are not necessarily drawn to scale. Additionally, elements common between drawings may retain the same numerical designation. However, any similarity in numbering does not mean that the structures or components are necessarily identical in size, composition, configuration, or other property.

The embodiments of the present disclosure include methods of forming pitch-doubled patterns using a so-called "anti-spacer" technique. Among other operations, the methods include faulting a first pattern in a first photosensitive resist material over a substrate, deprotecting a portion of the first photosensitive resist material with a chemically active species (e.g., by exposing the first photosensitive resist material to heat in the presence of an acid to diffuse the acid into a portion of the first photosensitive resist material, also referred to as an "acid bake"), forming a second photosensitive resist material over the substrate and between features of the first photosensitive resist material, exposing portions of the first and second photosensitive resist materials to radiation through a mask, and removing (e.g., developing) the exposed portions of the first and second photosensitive resist materials and the deprotected portions of the first photosensitive resist material. Such methods may be used to efficiently form features of varying sizes and shapes in an underlying material, such as metal lines, pads, and/or traces in an array region of a semiconductor device. In some embodiments, the methods of the present disclosure may be used to form features for a memory device. Relatively complex, two-dimensional patterns may be formed using the methods disclosed herein at sizes (e.g., pitches) below those possible using only conventional photolithography techniques.

FIGS. 1A through 7B illustrate a method of forming a pattern in a semiconductor device structure according to an embodiment of the present disclosure.

Figure 1A:
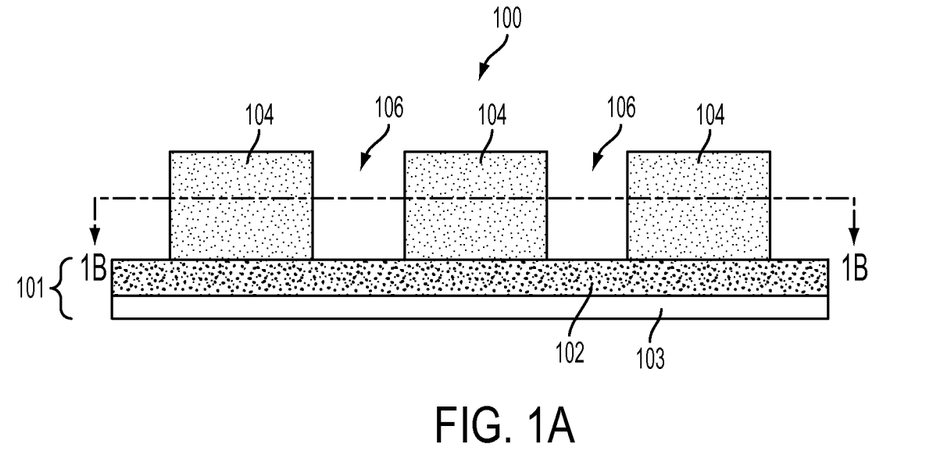
FIG. 1A is a partial cross-sectional side view of a semiconductor device structure according to an embodiment of the present disclosure.
Figure 1B:
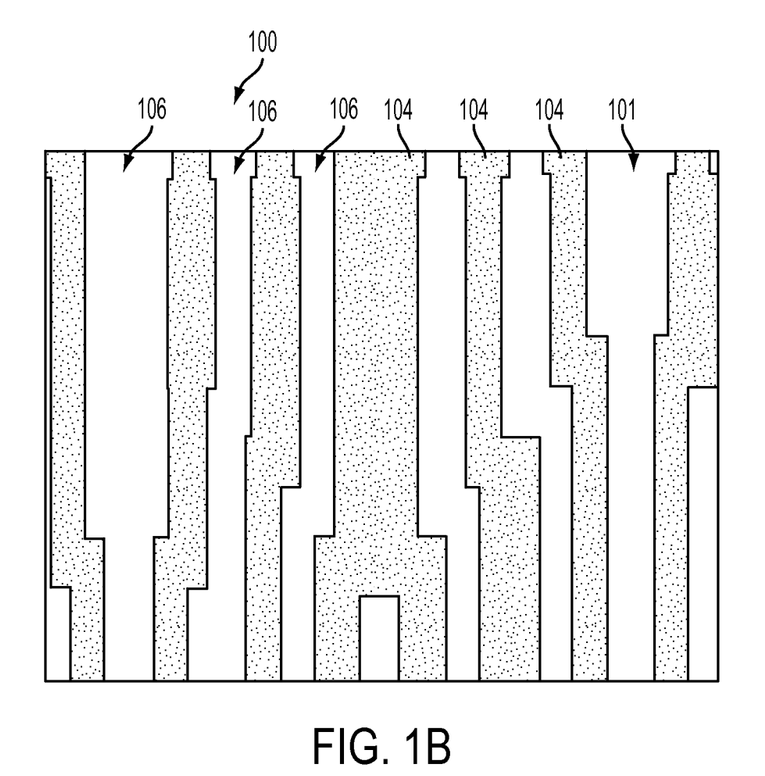
FIG. 1B is a partial cross-sectional top view of the semiconductor device structure of FIG. 1A, taken along section line 1B-1B of FIG. 1A.

Referring to FIGS. 1A and 1B, a portion of a semiconductor device structure 100 is shown that includes a substrate 101 and a patterned first resist material 104 formed over the substrate 101. The substrate 101 may include a metal material 102 to be patterned, such as may be used to form electrically conductive lines, pads, and/or traces in an array region of the semiconductor device structure 100. In some embodiments, one or more intermediate materials may, optionally, be formed between the first resist material 104 and the metal material 102 of the substrate 101, such as an anti-reflective coating (e.g., a bottom anti-reflective coating, a dielectric anti-reflective coating (e.g., silicon oxynitride or a hardmask material, such as a carbon or an organic material), etc.), as is known in the art. In addition, the substrate 101 may include an active area 103 underlying the metal material 102. The active area 103 may include other features, structures, and layers of various materials, such as a semiconductor material, transistors of a memory array, capacitors, electrically conductive vias, electrical contacts, a dielectric material, etc. The active area 103 may be formed by conventional techniques, which are not described in detail herein. The metal material 102 may be electrically coupled to one or more of these features in the underlying active area 103, for forming electrical pathways for providing functional access to the features of the active area 103.

Although the present disclosure generally describes patterning a metal material 102, the disclosure is not so limited. For example, the methods of the present disclosure may be used to pattern an oxide material, a semiconductor material, a nitride material, or any other material of a substrate.

Array regions of semiconductor device structures, such as structures for memory devices, generally include a large number of densely packed, repeated features, such as transistors, conductive lines, conductive pads, etc. The methods of the present disclosure may be used to form relatively small features of array regions, although one of ordinary skill in the art will recognize that the methods may also be used for forming features in other regions of semiconductor device structures, such as relatively larger features in peripheral regions.

The first resist material 104 may be formed over the substrate 101 and patterned to form the pattern shown in FIGS. 1A and 1B. The first resist material 104 may be a photosensitive material having a solubility in a developer solution that may be altered by exposure to an appropriate radiation (e.g., light of a certain wavelength), as is known in the art of photolithography. The first resist material 104 may be sensitive to radiation having a 248 nm wavelength, radiation having a 193 nm wavelength, or radiation having another particular wavelength. In some embodiments, the first resist material 104 may be a so-called "positive tone" resist, meaning that portions of the first resist material 104 that are exposed to the appropriate radiation become soluble and removable in the developer solution, while portions of the first resist material 104 that are not exposed to the radiation remain insoluble in the developer solution. The first resist material 104 may include a material that is more easily developed (e.g., that becomes soluble in a developer solution) when exposed to a chemically active species (e.g., an acid or a base), such as a so-called "chemically amplified resist" material. Some chemically amplified resists may be formed by attaching functional groups to a resist to protect the resist from being soluble within the developer solution. Such functional groups are also referred to herein as "protection groups." A photoacid generator (PAG) (e.g., an onium salt) may be added to the chemically amplified resist. Exposure to appropriate radiation induces the PAG to generate an acid (i.e., a chemically active species), which may react with the protection groups to effect so-called "deprotection" of the resist. Thus, the deprotected resist may be more soluble in the developer solution, while portions of the resist that have not undergone the deprotection reaction remain protected by the protection groups and, therefore, remain insoluble in the developer solution. The deprotection reaction may be facilitated by exposing the chemically amplified resist to heat. Additionally or alternatively, the deprotection reactions may take place using a chemically active species that is not provided by a PAG, such as by diffusing an acid or a base into the resist from a liquid solution. Some chemically amplified resists may undergo depolymerization when exposed to a chemically active species rather than, or in addition to, deprotection reactions.

By way of example and not limitation, the first resist material 104 may include one or more of a methacrylate material (e.g., poly(methyl methacrylate) (PMMA)), an acrylate material (e.g., poly(2,2,2-trifluoroethyl-chloroacrylate) (commercially available as EBR-9, for example)), a polyhydroxystyrene (PHOST) material with an tert-butoxycarbonyl (tBOC) protection group (PBOCST), a poly[4-(2-hydroxyhexafluoroisopropyl)styrene] material with a tBOC protection group, a poly(4-tert-butoxycarbonyloxystyrene) (PTBS) material with a tBOC protection group, a poly(4-t-butoxycarbonyloxystyrene-sulfone) (PTBSS) material, and a polyether material based on alkoxypyrimidine units. However, any photosensitive resist material more easily developed as a result of exposure to a chemically active species may be used for the first resist material 104.

The first resist material 104 may be soluble in a first solvent to facilitate application of the first resist material 104 onto the substrate 101. For example, the first resist material 104 may applied to the substrate 101 in liquid form (i.e., in a solution with the first solvent) using a spin-coating operation, after which the first resist material 104 may be hardened by removal of the first solvent, such as by evaporating the first solvent from the first resist material 104 by application of heat, for example. The removal of the first solvent may solidify the first resist material 104 to enable the first resist material 104 to hold its shape when patterned.

The first solvent used depends on the particular material used for the first resist material 104. For example, if the first resist material 104 is a PMMA material, then the first solvent may be propylene glycol monomethyl ether acetate (PG-MEA), methyl isobutyl ketone (MIBK), acetone, methyl ethyl ketone (MEK), N-methylpyrrolidone (NMP), chlorobenzene, ethylbenzene, ethyl lactate, etc., in which PMMA may be soluble. However, PMMA is not substantially soluble in isopropyl alcohol (IPA), ethanol, etc., and such solvents may not be used in the application of the first resist material 104 if the first resist material 104 is a PMMA material.

Conventional photolithography techniques may be used to form the pattern in the first resist material 104, as shown in FIGS. 1A and 1B. For example, after the first resist material 104 is formed over the substrate 101 and the first solvent is removed, the first resist material 104 may be exposed to a pattern of radiation of an appropriate wavelength as directed through a mask (not shown) disposed over the first resist material 104. The mask may include transparent portions through which the radiation may pass and opaque portions that block the radiation from passing. As mentioned above, portions of the first resist material 104 exposed to the radiation may become soluble in a developer solution, while non-exposed portions of the first resist material 104 may remain insoluble in the developer solution. In some embodiments, a so-called "post-exposure bake" (PEB) may be performed to subject the semiconductor device structure 100 to an elevated temperature prior to developing and removing portions of the first resist material 104, as is known in the art. The first resist material 104 may be subject to development using a suitable developer solution, depending on the selected material of the first resist material 104. For example, the developer solution may include tetramethylammonium hydroxide (TMAH), tetrabutylammonium hydroxide (TBAH), or an alkaline developer. The development may remove the portions of the first resist material 104 exposed to the radiation to form trenches 106 or other spaces between the remaining portions of the first resist material 104, as shown in FIGS. 1A and 1B. The substrate 101 may be exposed (i.e., uncovered) in the trenches 106 between remaining portions of the first resist material 104.

Figure 2:
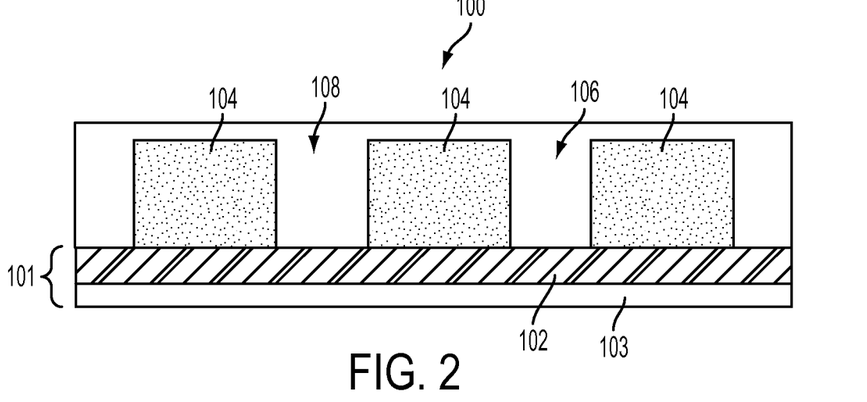
FIG. 2 is a partial cross-sectional side view of the semiconductor device structure of FIG. 1A showing an acid solution disposed over and around a first resist material.

Referring to FIG. 2, a chemically active species may be disposed over the semiconductor device 100 proximate and in contact with the first resist material 104. By way of example, an acid solution 108 may be used to provide the chemically active species. For example, the acid solution 108 may include one or more of triflic acid and perfluorobutanesulfonic acid (PFBS). The acid solution 108 may at least substantially fill the trenches 106 between the portions of the first resist material 104 and may cover top surfaces of the first resist material 104, as shown in FIG. 2. The acid solution 108 may be applied by conventional techniques, such as by spin-coating the acid solution 108 over the semiconductor device structure 100.

Figure 3:
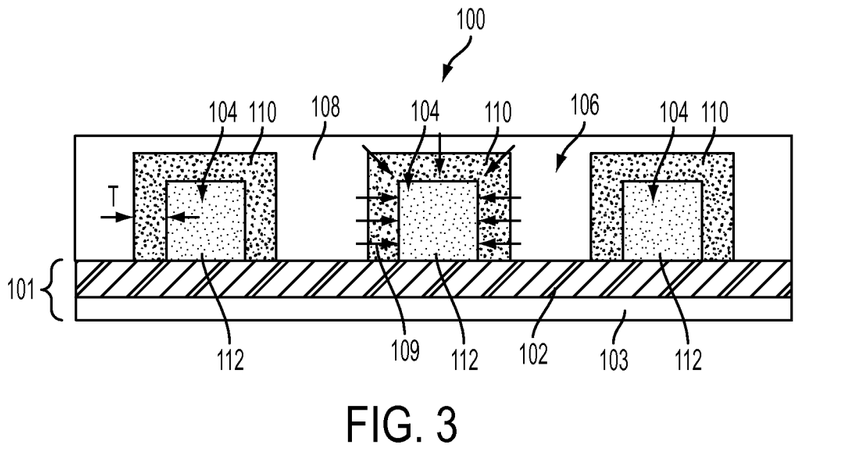
FIG. 3 is a partial cross-sectional side view of the semiconductor device structure of FIG. 2 showing acid diffused into an outer portion of the first resist material, causing the outer portion of the first resist material to be chemically deprotected.

Referring to FIG. 3, acid from the acid solution 108 may diffuse into an outer portion 110 of the first resist material 104, as represented by arrows 109, by exposing the semiconductor device structure 100 and the acid solution 108 to a predetermined temperature for a predetermined time sufficient to diffuse the acid into a desired volume (e.g., depth) of the first resist material 104. By way of example and not limitation, the predetermined temperature for diffusing the acid into the outer portion 110 of the first resist material 104 may be between about 80° C. and about 130° C., and the predetermined time may be between about 0.5 minute and about 3 minutes. The temperature may facilitate an acid-catalyzed reaction that deprotects the outer portion 110 of the first resist material 104. The reaction may be controlled to leave an inner portion 112 of the first resist material 104 protected, such as by selecting an appropriate type of acid solution 108, predetermined temperature, and predetermined time. Thus, the solubility of the outer portion 110 of the first resist material 104 in a developer solution may be altered, such that the outer portion 110 may be selectively removed (i.e., developed) relative to the inner portion 112 of the first resist material 104. The outer portion 110 and the inner portion 112 are also referred to herein as the deprotected portion 110 and the protected portion 112, respectively.

A thickness T of the deprotected portion 110 may ultimately define a width of spaces between features formed in the metal material 102 of the substrate 101, as will be explained in more detail below. Since the thickness T of the deprotected portion 110 is controlled by, for example, controlling the temperature and/or time of acid diffusion into the first resist material 104, the width of the spaces between the features formed in the metal material 102 may be determined independent of, and potentially smaller than, the dimensional limits of conventional photolithography techniques.

Figure 4A:
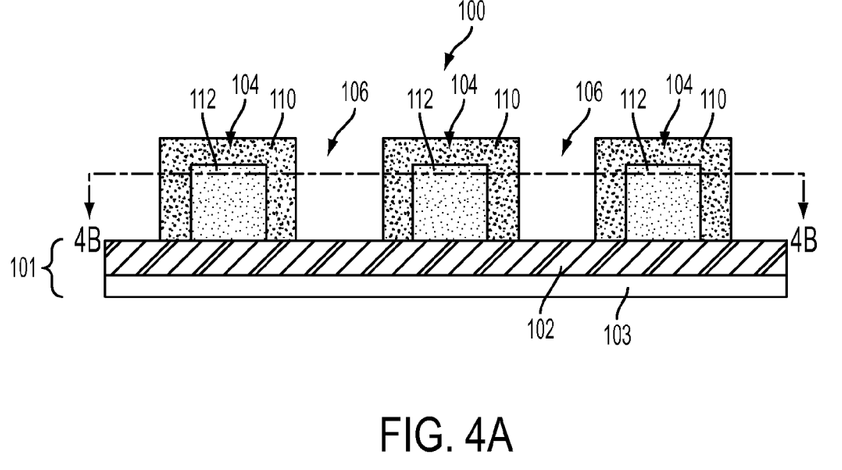
FIG. 4A is a partial cross-sectional side view of the semiconductor device structure of FIG. 3 after the acid solution is removed from over and around the first resist material.
Figure 4B:
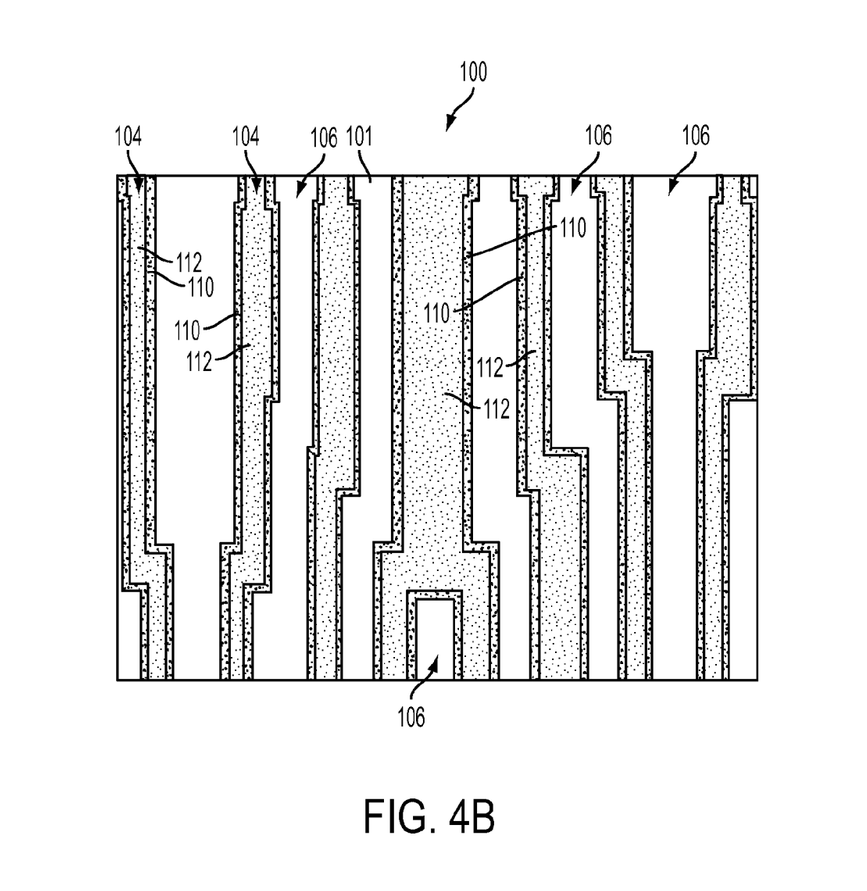
FIG. 4B is a partial cross-sectional top view of the semiconductor device structure of FIG. 4A, taken along section line 4B-4B of FIG. 4A.

Referring to FIGS. 4A and 4B, after diffusing acid into the first resist material 104, the acid solution 108 (FIG. 3) remaining over the semiconductor device structure 100 may be removed, such as by rinsing the semiconductor device structure 100 in water, for example. At this point, the semiconductor device structure 100 may include the first resist material 104 formed in a pattern over the substrate 101, with the substrate 101 being exposed (e.g., uncovered) through the trenches 106 between portions of the first resist material 104. The deprotected portion 110 of the first resist material 104 may extend along lateral sides of the first resist material 104 and may define sidewalls of the trenches 106. The inner portion 112 of the first resist material 104 may remain protected (i.e., insoluble in a developer solution).

Figure 5A:
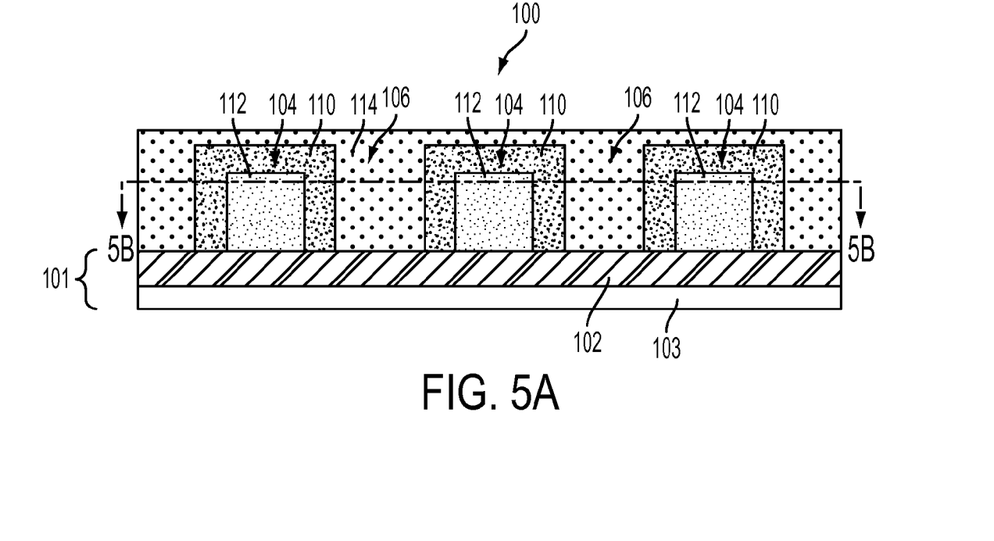
FIG. 5A is a partial cross-sectional side view of the semiconductor device structure of FIG. 4A after a second resist material is formed on the semiconductor device structure.
Figure 5B:
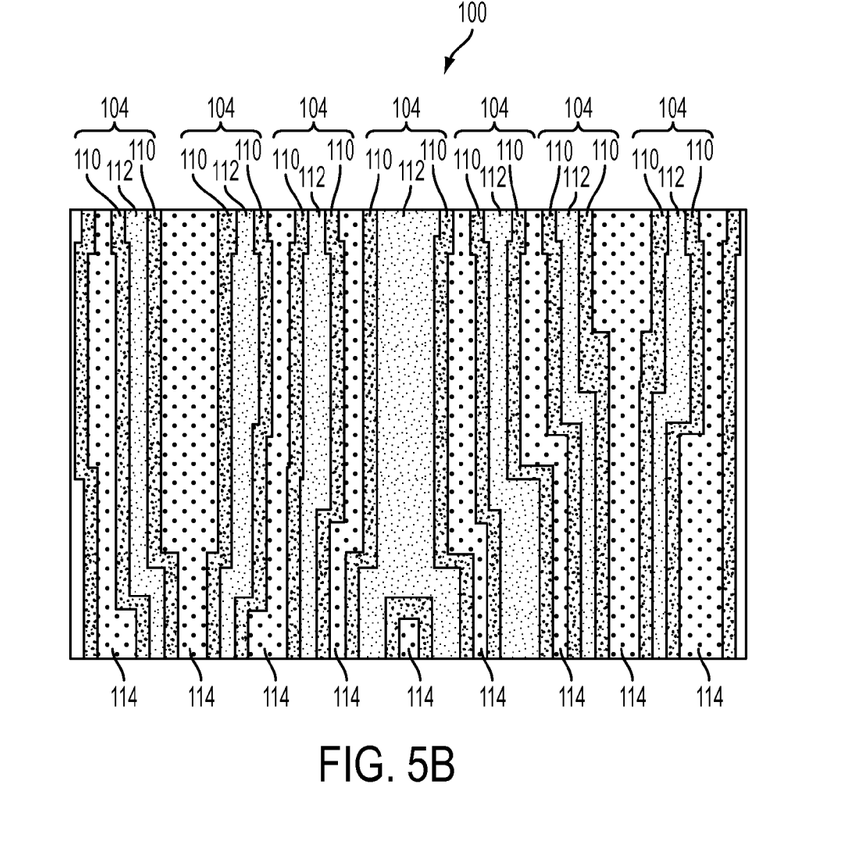
FIG. 5B is a partial cross-sectional top view of the semiconductor device structure of FIG. 5A, taken along section line 5B-5B of FIG. 5A.

Referring to FIGS. 5A and 5B, a second resist material 114 may be disposed over the semiconductor device structure 100, such as within the trenches 106 between the remaining portions of the first resist material 104. Initially, the second resist material 114 may be dissolved in a second solvent, such as to facilitate a spin-coating operation used to dispose the second resist material 114 over the semiconductor device structure 100. At least the deprotected portion 110 of the first resist material 104, or the entire first resist material 104, may be insoluble in the second solvent. Thus, material of the second resist material 114 may be selected to be soluble in the second solvent, which may be different than the first solvent used for forming the first resist material 104, in which at least the deprotected portion 110 of the first resist material 104 may be soluble. The deprotected portion 110 of the first resist material 104 may be substantially insoluble in the second solvent, to enable the pattern formed by the first resist material 104 to remain intact while the second resist material 114 is disposed in the trenches 106. By way of example and not limitation, the first resist material 104 may be selected to be soluble in PGMEA, cyclohexanone, and/or MIBK, and the second resist material 114 may be selected to be soluble in an alcohol-based solvent (e.g., decanol, IPA, ethanol), a water-based solvent, and/or anisole (methoxybenzene).

In addition, the second resist material 114 may be photosensitive to enable a pattern to be formed in the second resist material 114 using conventional photolithographic techniques, as will be explained in more detail below. In some embodiments, the second resist material 114 may be sensitive to the same wavelength of radiation to which the first resist material 104 is sensitive, such that both the first resist material 104 and the second resist material 114 may be exposed to radiation simultaneously through a single mask. For example, each of the first and second resist materials 104, 114 may be sensitive to radiation having a 248 nm wavelength, radiation having a 193 nm wavelength, or radiation having another particular wavelength. In other embodiments, the second resist material 114 may be sensitive to radiation having a different wavelength compared to the first resist material 104. The second resist material 114 may be a positive tone resist, as described above with reference to the first resist material 104.

Although the first and second resist materials 104, 114 are both described herein as positive tone resists, the present disclosure is not so limited. For example, in other embodiments, the first resist material 104 may be a positive tone resist and the second resist material 114 may be a negative tone resist, which is characterized as being insoluble in a developer solution after being exposed to an appropriate radiation, while portions thereof that have not been exposed to radiation are soluble in the developer solution.

As mentioned above, the second resist material 114 may be formulated to be developed in a developer solution after exposure to an appropriate wavelength of radiation. In some embodiments, the second resist material 114 may be selected to be developed in the same developer solution as the first resist material 104. For example, portions of each of the first and second resist materials 104, 114, along with the deprotected portions 110 of the first resist material 104, may be developed and removed by TMAH, TBAH, and/or an alkaline developer.

By way of example and not limitation, and depending on the material selected for the first resist material 104 based on the criteria described above (e.g., solubility, photosensitivity, and/or development relative to the first resist material 104), the second resist material 114 may include one or more of a methacrylate material (e.g., PMMA), a polyhydroxystyrene material, a poly(butene-1-sulfone) (PBS) material, an acrylate material (e.g., poly(2,2,2-trifluoroethyl-chloroacrylate)

(commercially available as EBR-9, for example)), and a copolymer of chloromethacrylate and methylstyrene (commercially available as ZEP-520, for example). The materials listed herein for the second resist material 114 are offered by way of example only among a larger group of commercially available photoresist materials from which one of ordinary skill in the art may choose given a particular application and given the material selected for the first resist material 104. Since the second resist material 114 is to be chemically modified by exposure to light and not necessarily by exposure to a chemically active species (e.g., an acid solution), the second resist material 114 need not be a chemically amplified resist material, although the second resist material 114 may be a chemically amplified resist material in some embodiments.

After disposing the second resist material 114 over the semiconductor device structure 100, at least a substantial portion of the second solvent may be removed from the second resist material 114. For example, the second resist material 114 may be subjected to an elevated temperature to facilitate evaporation of the second solvent from the second resist material 114.

As shown in FIGS. 5A and 5B, at this point the semiconductor device structure 100 may include alternating volumes of the first resist material 104 and the second resist material 114. Each of the remaining portions of the first resist material 104 may include an inner, protected portion 112 and an outer, deprotected portion 110. The deprotected portions 110 may separate protected portions 112 of the first resist material 104 from adjacent portions of second resist material 114.

Figure 6A:
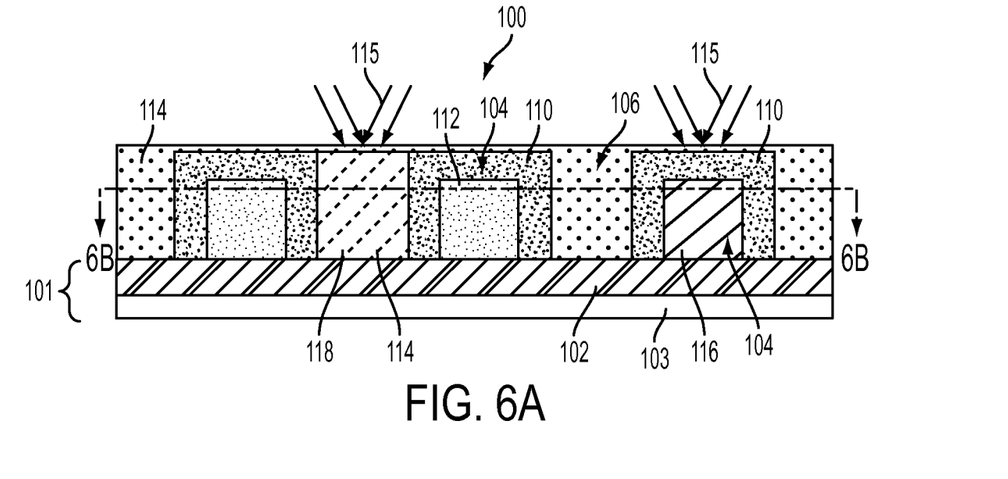
FIG. 6A is a partial cross-sectional side view of the semiconductor device structure of FIG. 5A showing a portion of the first resist material and a portion of the second resist material being exposed to radiation.
Figure 6B:
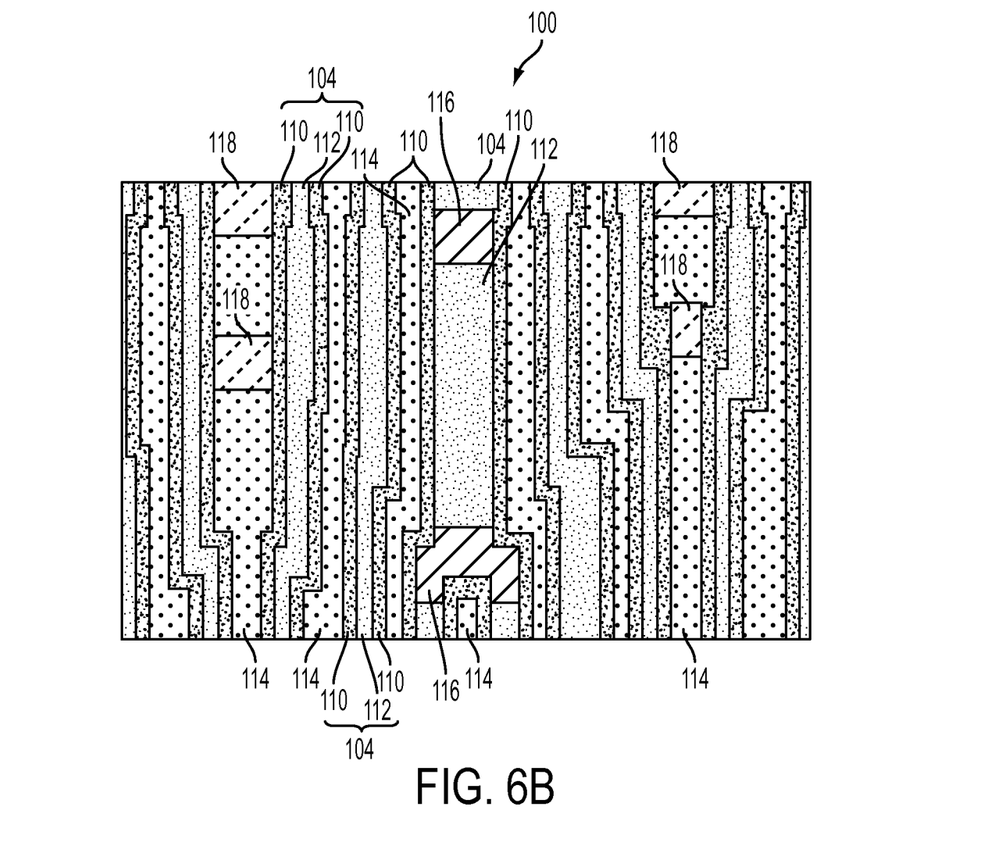
FIG. 6B is a partial cross-sectional top view of the semiconductor device structure of FIG. 6A, taken along section line 6B-6B of FIG. 6A.

Referring to FIGS. 6A and 6B, selected portions of the first resist material 104 and of the second resist material 114 may be exposed to appropriate radiation, shown at arrows 115 in FIG. 6A, through at least one mask (not shown). Since both the first resist material 104 and the second resist material 114 may be photosensitive, exposed portions 116 (i.e., portions exposed to radiation) of the first resist material 104 and exposed portions 118 (i.e., portions exposed to radiation) of the second resist material 114 may become soluble in a developer solution due to the exposure to the radiation. At least some of the exposed portions 116 of the first resist material 104 and at least some of the exposed portions 118 of the second resist material 114 may be located in an array region of the semiconductor device structure 100. Although not shown for simplicity, portions of the first resist material 104, of the second resist material 114, or both, in a peripheral region of the semiconductor device structure 100 may also be exposed to the radiation through the mask for forming peripheral features of the semiconductor device structure 100. The exposed portions 116, 118 of the first and second resist materials 104, 114 may be positioned in locations where a gap (e.g., a break) in a feature is to be formed in the metal material 102 of the substrate 101 underlying the first and second resist materials 104, 114. Thus, the exposed portions 116, 118 may be positioned to isolate features to be formed in the metal material 102 from each other.

As described above, in some embodiments, both the first and second resist materials 104, 114 may be sensitive to the same wavelength of radiation. In such embodiments, the first resist material 104 and the second resist material 114 may be simultaneously exposed to the same wavelength of radiation through a single mask.

After the exposure is complete, in some embodiments, a so-called "post-exposure bake" may be performed to subject the first and second resist materials 104, 114 to an elevated temperature, as is known in the art. In some embodiments, the post-exposure bake may result in diffusion of acid from the deprotected portion 110 of the first resist material 104 into the second resist material 114, which may result in deprotection of a portion of the second resist material 114 proximate the first resist material 104.

Figure 7A:
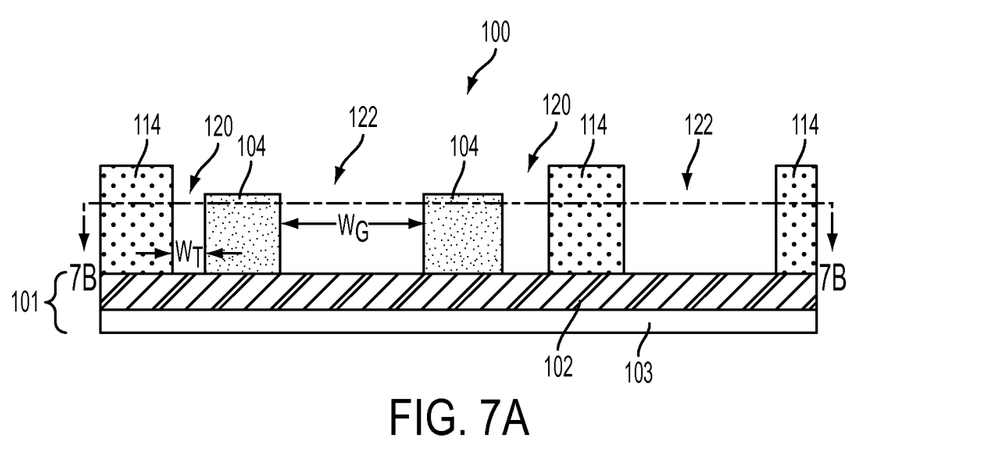
FIG. 7A is a partial cross-sectional side view of the semiconductor device structure of FIG. 6A after the exposed portion of the first resist material, the exposed portion of the second resist material, and the deprotected portion of the first resist material is removed.
Figure 7B:
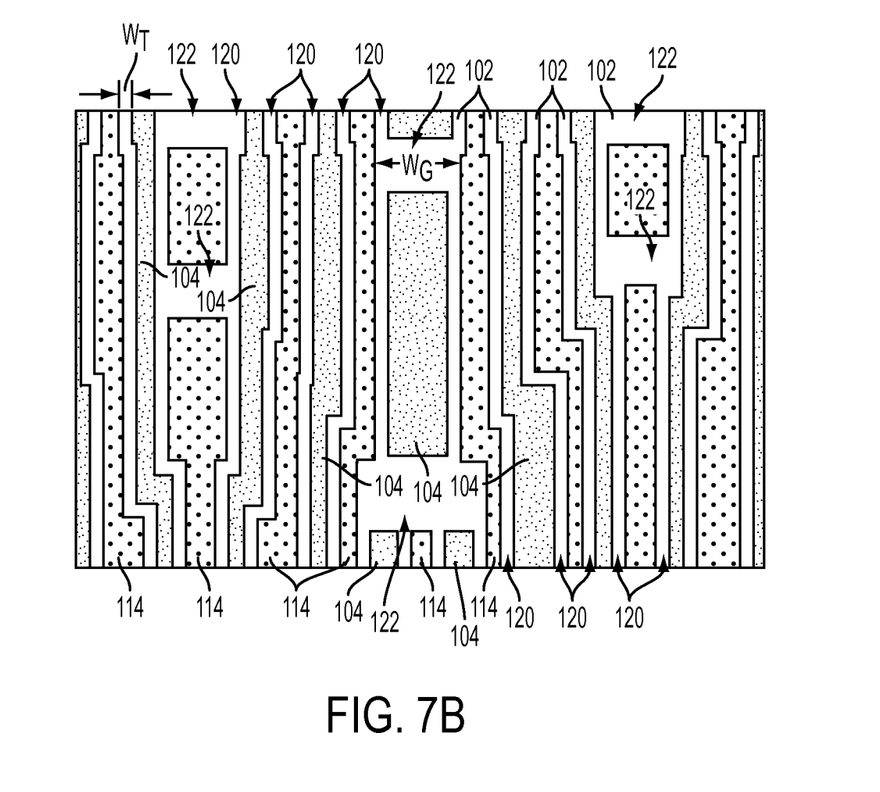
FIG. 7B is a partial cross-sectional top view of the semiconductor device structure of FIG. 7A, taken along section line 7B-7B of FIG. 7A.

Referring to FIGS. 7A and 7B in conjunction with FIGS. 6A and 6B, the first and second resist materials 104, 114 may be subject to development to remove the deprotected portions 110 of the first resist material 104, the exposed portions 116 of the first resist material 104, and the exposed portions 118 of the second resist material 114. Trenches 120 may be formed where the deprotected portions 110 of the first resist material 104 are removed, and gaps 122 may be formed where the exposed portions 116, 118 of the first and second resist material 104, 114 are removed. The trenches 120 may have a width $W_T$ (FIGS. 7A and 7B) defined by the thickness T (FIG. 3) of the deprotected portions 110 of the first resist material 104. Thus, the width $W_T$ of the trenches 120 may be independent of, and potentially smaller than, the resolution limits of conventional photolithography. The gaps 122 may have a width $W_G$ defined by the thickness T of two adjacent deprotected portions 110 and a corresponding thickness of either a protected portion 112 (FIGS. 6A and 6B) (which has been modified to be an exposed portion 116) or a portion of second resist material 114 (which has been modified to be an exposed portion 118) between the adjacent deprotected portions 110. Thus, the width $W_G$ of the gaps 122 may be at least as wide as the protected portions 112 of the first resist material 104 or as the trenches 106 originally formed in the first resist material 104 by conventional photolithography (FIGS. 1A and 1B). Therefore, the width $W_G$ of the gaps 122 may be the same as or greater than the dimensional limits of conventional photolithography. The metal material 102 of the substrate 101 may be exposed (i.e., uncovered) through the trenches 120 and gaps 122.

As described above, in some embodiments, both the first and second resist materials 104, 114 may be developed by the same developer, such as TMAH, TBAH, and/or an alkaline developer. In such embodiments, a single development operation using a single developer solution may be performed to remove the deprotected portions 110 of the first resist material 104 and the exposed portions 116, 118 of the first and second resist materials 104, 114.

Figure 8A:
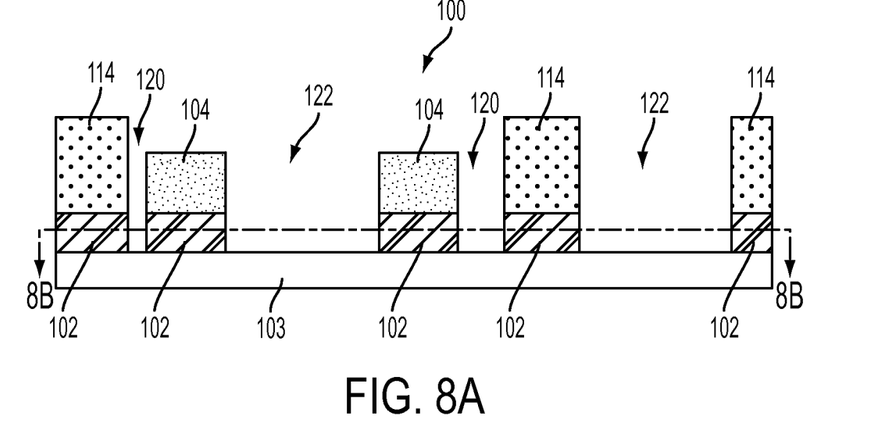
FIG. 8A is a partial cross-sectional side view of the semiconductor device structure of FIG. 7A after portions of a substrate have been removed through a pattern in the first and second resist materials to form features in the substrate.
Figure 8B:
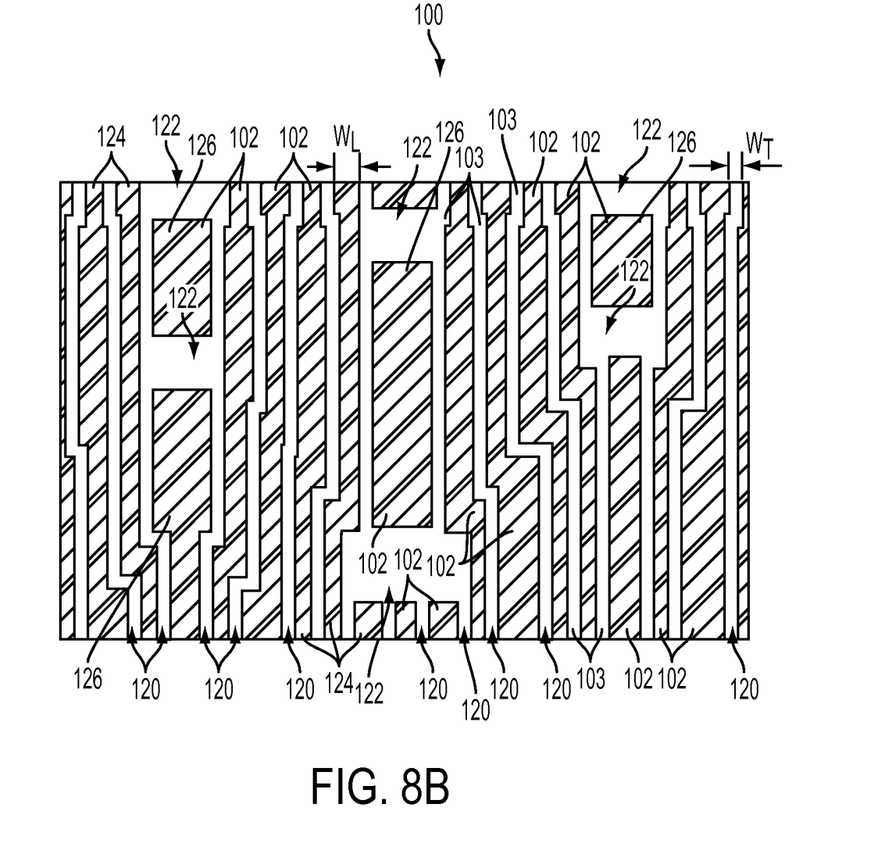
FIG. 8B is a partial cross-sectional top view of the semiconductor device structure of FIG. 8A, taken along section line 8B-8B of FIG. 8A.

Referring to FIGS. 8A and 8B, portions of the metal material 102 (or other material to be patterned) exposed (i.e., uncovered) through the trenches 120 and gaps 122 may be removed, such as by an etch operation (e.g., an anisotropic dry etch operation). Underlying portions of the substrate 101, such as the active area 103, may be exposed through the trenches 120 and gaps 122. Portions of the metal material 102 covered by the first and second resist materials 104, 114 may remain over the active area 103. Thus, the pattern of the first and second resist materials 104, 114 may be transferred to the metal material 102 to form, for example, metal lines 124 and metal pads 126. In embodiments in which the material of the substrate 101 to be patterned is not a metal material (e.g., an oxide material, a semiconductor material, a nitride material, etc.), transferring the pattern of the first and second resist materials 104, 114 to the material of the substrate 101 may form features other than the metal lines 124 and metal pads 126. The gaps 122 may electrically isolate portions of the metal material 102 on opposing sides of the gaps 122, such as above and below the gaps 122 in the view of FIG. 8B. Thus, the gaps 122 may be used to isolate the metal lines 124 or other features of the metal material 102 that would otherwise be connected if the gaps 122 were not formed.

As shown in FIG. 8B, the metal lines 124 may have a width $W_L$ defined by a corresponding width of remaining first resist material 104 or second resist material 114 between adjacent trenches 120. As explained above, the width $W_T$ of the trenches 120 between adjacent metal lines 124 and/or metal pads 126 may be defined by the thickness T of the deprotected portions 110 of the first resist material 104 (FIG. 3). Since the width $W_T$ of the trenches 120 is defined by controlling the single operation of diffusing a chemically active species into the first resist material 104, each of the trenches 120 may have an at least substantially uniform width $W_T$. The uniformity of the width $W_T$ of the trenches 120 between conductive features formed in the metal material 102 may simplify compensating for electrical signal noise and/or capacitance that may exist between adjacent metal lines 124 and/or metal pads 126 during operation of a final semiconductor device foamed from the semiconductor device structure 100.

After the metal material 102 is patterned by removing exposed (i.e., uncovered) portions of the metal material 102, the first and second resist materials 104, 114 may be at least substantially completely removed from over the metal material 102, such as by rinsing the semiconductor device structure 100 in a suitable solvent for dissolving the remaining first and second resist materials 104, 114, by an abrasive process (e.g., grinding), or by a so-called "plasma stripping" operation, for example. In addition, the trenches 120 and gaps 122 between the metal lines 124 and metal pads 126 may be filled with an insulating material to maintain electrical isolation between the metal lines 124 and metal pads 126.

Accordingly, the present disclosure includes methods of forming a pattern in a semiconductor device structure. In accordance with such methods, an outer portion of a first photosensitive resist material over a substrate may be deprotected with a chemically active species. A second photosensitive resist material may be formed over the substrate, and portions of the first and second photosensitive resist materials may be exposed to radiation. The deprotected portion of the first photosensitive resist material and the exposed portions of the first and second photosensitive resist materials may be removed.

The present disclosure also includes methods of forming a semiconductor device. In accordance with such methods, a first resist material is formed in a pattern over an array region of a substrate. The first resist material includes an inner portion insoluble in a developer solution and an outer portion soluble in the developer solution. A second resist material is formed over the array region of the substrate and between adjacent portions of the first resist material. Portions of the first material over the array region are exposed to radiation sufficient to cause inner portions thereof to become soluble in the developer solution. Portions of the second resist material over the array region are exposed to radiation sufficient to cause portions of the second resist material to become soluble in the developer solution. The first and second resist materials are developed in the developer solution to remove the outer portion of the first resist material, the exposed inner portions of the first resist material, and the exposed portions of the second resist material.

FIGS. 9 through 12 illustrate a method of forming a pattern in a semiconductor device structure according to another embodiment of the present disclosure. In some embodiments, the pattern shown and described with reference to FIGS. 9 through 12 may be formed in an array region of the semiconductor device structure, although the methods described may be applied to form patterns in a peripheral region, as will be understood by one of ordinary skill in the art.

Figure 9:
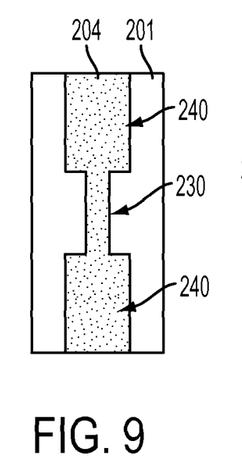
FIG. 9 is a top view of a semiconductor device structure showing a first resist material including at least one first portion that is relatively thinner than at least one second portion thereof.

Referring to FIG. 9, a first resist material 204 may be formed and patterned over a substrate 201, essentially as described above with reference to patterning the first resist material 104 of FIG. 1A and 1B. However, the first resist material 204 may include at least one first portion 230 and at least one second portion 240. The particular lateral width of the at least one first portion 230 and of the at least one second portion 240 may be determined given a particular application. In any case, the lateral width of the least one first portion 230 may be smaller than the lateral width of the at least one second portion 240. Both of the at least one first portion 230 and the at least one second portion 240 may be defined by conventional photolithography techniques. The first resist material 204 may be a photosensitive material that is subject to deprotection by a chemically active species, as described above with reference to the first resist material 104 of FIG. 1A and 1B.

Figure 10:
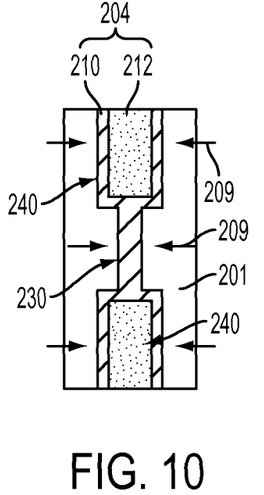
FIG. 10 is a top view of the semiconductor device structure of FIG. 9 after outer portions of the first resist material are chemically deprotected by a chemically active species, including the entire at least one first portion.

Referring to FIG. 10, a chemically active species, such as an acid solution, may be disposed over the substrate 201 and proximate the first resist material 204, essentially as described above with reference to FIGS. 2 through 4B. The chemically active species (e.g., an acid) may be diffused into portions of the first resist material 204, as represented by arrows 209. The acid solution may then be removed. In the at least one second portion 240 of the first resist material 204, an outer portion 210 of the first resist material 204 may be deprotected (i.e., become soluble in a developer solution) by the acid, while an inner portion 212 of the first resist material 204 may remain protected (i.e., insoluble in the developer solution). However, in the at least one first portion 230 of the first resist material 204, the acid may deprotect the entire first resist material 204, leaving no protected portion. Thus, the deprotected portion 210 of the first resist material 204 in the at least one first portion 230 may extend all the way across and through the first resist material 204. The original lateral thickness of the relatively thin at least one first portion 230 may be selected to be no more than two times the distance that the acid is intended to diffuse into the first resist material 204. The deprotection reaction may be controlled (such as by subjecting the structure to an appropriate temperature and/or for an appropriate length of time) to entirely deprotect the at least one first portion 230, while not entirely deprotecting the at least one second portion 240.

Figure 11:
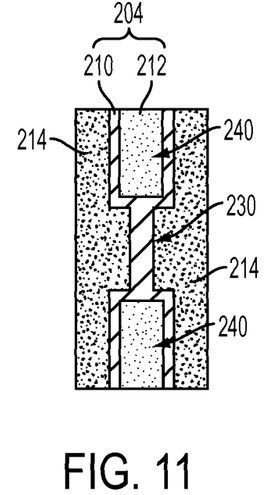
FIG. 11 is a top view of the semiconductor device structure of FIG. 10 after a second resist material is formed on the semiconductor device structure.

Referring to FIG. 11, a second resist material 214 may be disposed over the substrate 201 (FIG. 10) and adjacent to the first resist material 204, essentially as described above with reference to FIGS. 5A and 5B. In some embodiments, the second resist material 214 may be photosensitive, as described above with reference to FIGS. 5A and 5B.

Optionally, portions of one or both of the first resist material 204 and the second resist material 214 (if the second resist material 214 is photosensitive) may be exposed to radiation through a mask, essentially as described above with reference to FIGS. 6A and 6B. For example, portions of the second resist material 214 may be exposed to radiation for forming gaps to isolate remaining portions of the second resist material 214, as described above. In addition, portions of the first and/or second resist material 204, 214 in a peripheral region may be exposed to radiation for forming peripheral features. In some embodiments, the second resist material 214 may be exposed to radiation through a mask, while the first resist material 204 is not exposed through a mask.

Figure 12:
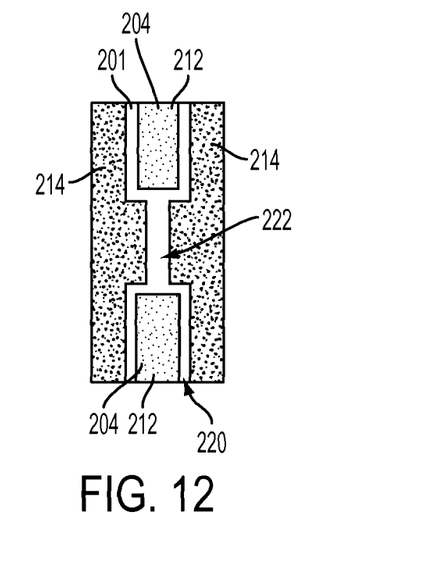
FIG. 12 is a top view of the semiconductor device structure of FIG. 11 after the deprotected portion of the first resist material is removed.

Referring to FIG. 12, the deprotected portions 210 (FIG. 11) of the first resist material 204 may be removed with a suitable developer solution to form trenches 220, essentially as described above with reference to FIGS. 7A and 7B. The protected portions 212 of the first resist material 204 may remain after the development. Since the entire at least one first region 230 (FIG. 11) of the first resist material 204 was deprotected, the entire at least one first region 230 may be removed in the developer solution, as shown in FIG. 12. Such a removal of the at least one first region 230 may form a gap 222 that creates a discontinuity in the first resist material 204 that isolates remaining portions of the first resist material 204 from each other. Optionally, if present, any portions of the first and second resist materials 204, 214 exposed to radiation may also be removed by the development.

After the development and removal of the deprotected portions 210 (FIG. 11) of the first resist material 204, portions of the substrate 201 (e.g., portions of a metal material of the substrate 201) may be removed, essentially as described above with reference to FIGS. 8A and 8B. Features, such as lines, traces, and/or pads, may be formed in a pattern that corresponds to the pattern of the first and second resist materials 204, 214.

Referring again to FIGS. 11 and 12, the relatively thin at least one first region 230 may be sized and configured to be at least substantially completely removed, to isolate portions of the substrate 201 underlying the first resist material 204 from each other. Thus, portions of the first resist material 204 may not need to be exposed to radiation through a mask to effect such an isolation. Accordingly, manufacturing complexity and time may be reduced compared to conventional methods that include an additional photolithographic process to isolate portions of the substrate 201. The method described with reference to FIGS. 9 through 12 may also be less expensive than conventional methods that may use an additional mask to isolate portions of the first resist material 204. In addition, masks must be properly aligned with the pattern to position transparent portions of the masks over the desired locations where the first resist material 204 is to be exposed to radiation. Misalignment of the mask may cause a device formed by such methods to be inoperable due to incomplete or improper isolation of features. In some embodiments, the method of FIGS. 9 through 12 may eliminate a risk of misalignment, since the additional mask may not be necessary to isolate portions of the first resist material 204.

Accordingly, the present disclosure includes additional methods of forming a pattern in a semiconductor device structure. In accordance with such methods, a first resist material is formed over a substrate. The first resist material includes at least one first portion and at least one second portion. The at least one first portion is relatively thinner than the at least one second portion. Substantially the entire at least one first portion is deprotected, and an outer portion of the at least one second portion of the first resist material is deprotected. An inner portion of the at least one second portion of the first resist material is left protected. A second resist material is formed over the substrate, and at least one portion of the second resist material is exposed to radiation. The deprotected portions of the first resist material and the exposed at least one portion of the second resist material are removed.

Although the methods of the present disclosure have been described in the context of forming metal features for a semiconductor device (e.g., memory) array, one of ordinary skill in the art will recognize that the methods and their equivalents may be used to form other features for semiconductor devices. For example, the methods of the present disclosure may be used to form any semiconductor device or structure that is to include features smaller than the resolution limit of conventional photolithography techniques. In addition, the features formed by the methods of the present disclosure may be metal features, dielectric features, semiconductor features, polymer features, ceramic features, or intermediate or final features of any other material. The methods of the present disclosure may also be used to form features the same size as is possible with conventional photolithography techniques.

The methods of the present disclosure may provide an efficient process flow for creating small, pitch-multiplied features. In addition, the features of the metal material formed by the methods of the present disclosure may be relatively flat and uniform since the features are formed by a subtractive metal etching process through a resist pattern. In other words, metal material is formed as a layer and is then patterned through the resist pattern, as opposed to filling trenches and gaps with metal material then removing excess metal material as may be the case in some conventional methods. Thus, the methods of the present disclosure may avoid dishing and/or other problems associated with some conventional pitch-multiplication methods.

The embodiments of the disclosure described above and illustrated in the accompanying drawing figures do not limit the scope of the invention, since these embodiments are merely examples of embodiments of the invention, which is defined by the appended claims and their legal equivalents. Any equivalent embodiments are intended to be within the scope of this disclosure. Indeed, various modifications of the present disclosure, in addition to those shown and described herein, such as alternative useful combinations of the elements described, may become apparent to those of ordinary skill in the art upon considering the present disclosure. Such modifications and embodiments are also intended to fall within the scope of the appended claims and their legal equivalents.

What is claimed is:

1. A method of forming a pattern in a semiconductor device structure, the method comprising:
    forming a first photosensitive resist material over a substrate;
    exposing the first photosensitive resist material to radiation through a mask;
    developing the first photosensitive resist material to form trenches in the first photosensitive resist material and expose the substrate between adjacent portions of the first photosensitive resist material;
    filling the trenches between the adjacent portions of the first photosensitive resist material with a chemically active species to form a chemically modified outer portion of each of the adjacent portions of the first photosensitive resist material while an inner portion of each of the adjacent portions of the first photosensitive resist material remains chemically unmodified;
    forming a second photosensitive resist material over the chemically modified outer portion of each of the adjacent portions of the first photosensitive resist material;
    exposing portions of the second photosensitive resist material to another radiation;
    exposing the inner portion of at least some of the adjacent portions of the first photosensitive resist material to the another radiation through the second photosensitive resist material and the chemically modified outer portion; and
    removing the chemically modified outer portion of each of the adjacent portions of the first photosensitive resist material, the exposed inner portion of each of the adjacent portions of the first photosensitive resist material, and the exposed portions of the second photosensitive resist material to form a pattern in the first photosensitive resist material and the second photosensitive resist material.

2. The method of claim 1, wherein the filling the trenches between the adjacent portions of the first photosensitive resist material with a chemically active species comprises:

disposing an acid solution in contact with the first photosensitive resist material; and diffusing acid from the acid solution into the first photosensitive resist material.

3. The method of claim 2, wherein the diffusing the acid from the acid solution into the first photosensitive resist material comprises subjecting the acid solution and the first photosensitive resist material to a temperature in the range of from about 80° C. to about 130° C.

4. The method of claim 2, wherein the diffusing the acid from the acid solution into the first photosensitive resist material comprises subjecting the acid solution and the first photosensitive resist material to a temperature for between about 0.5 minute and about 3 minutes.

5. The method of claim 2, wherein the disposing the acid solution comprises disposing one or more of a triflic acid and a perfluorobutanesulfonic acid.

6. The method of claim 1, wherein at least one of the exposed inner portions of the first photosensitive resist material and at least one of the exposed portions of the second photosensitive resist material are located in an array region of the semiconductor device structure.

7. The method of claim 1, wherein the developing the first photosensitive resist material to form the trenches in the first photosensitive resist material comprises forming the trenches in the first photosensitive resist material selected from the group consisting of a methacrylate material, an acrylate material, a polyhydroxystyrene material with an tert-butoxycarbonly (tBOC) protection group, a poly[4-(2-hydroxyhexafluoroisopropyl)styrene] material with a tBOC protection group, a poly(4-tert-butoxycarbonyloxystyrene) with a tBOC protection group, a poly(4-t-butoxycarbonyloxystyrene-sulfone) material, and a polyether material based on alkoxypyrimidine units.

8. The method of claim 1, wherein the forming the second photosensitive resist material over the chemically modified outer portion of each of the adjacent portions of the first photosensitive material comprises forming the second photosensitive resist material selected from the group consisting of a methacrylate material, a polyhydroxystyrene material, a poly(butene-1-sulfone) material, an acrylate material, and a copolymer of chloromethacrylate and methylstyrene.

9. The method of claim 1, further comprising selecting the second photosensitive resist material to be soluble in a different solvent than the first photosensitive resist material.

10. The method of claim 1, further comprising selecting the second photosensitive resist material to be sensitive to a wavelength of radiation to which the first photosensitive resist material is sensitive.

11. The method of claim 1, further comprising selecting the second photosensitive resist material to be formulated for development in a developer solution in which the first photosensitive resist material is formulated for development.

12. The method of claim 1, further comprising removing a portion of the substrate through the pattern in the first photosensitive resist material and the second photosensitive resist material.

13. The method of claim 12, wherein the removing the portion of the substrate through the pattern comprises removing portions of a metal material overlying an active area of the substrate to form a plurality of conductive features from the metal material.

14. A method of forming a pattern in a semiconductor device structure, the method comprising:

forming a first resist material over a substrate to include at least one first portion and at least one second portion adjacent the at least one first portion, the at least one first portion being relatively thinner than the at least one second portion;

diffusing a chemically active species into substantially all of the at least one first portion of the first resist material to form a chemically modified at least one first portion of the first resist material;

diffusing the chemically active species into an outer portion of the at least one second portion of the first resist material to form a chemically modified outer portion of the at least one second portion of the first resist material while leaving an inner portion of the at least one second portion of the first resist material chemically unmodified;

forming a second resist material adjacent to the chemically modified at least one first portion of the first resist material and the chemically modified outer portion of the at least one second portion of the first resist material;

exposing at least one portion of the second resist material to radiation; and removing the chemically modified at least one first portion of the first resist material, the chemically modified outer portion of the at least one second portion of the first resist material, and the exposed at least one portion of the second resist material.

15. The method of claim 14, further comprising:

exposing the chemically unmodified inner portion of the at least one second portion of the first resist material to the radiation; and removing the exposed chemically unmodified inner portion of the at least one second portion of the first resist material.

16. The method of claim 14, wherein the removing the chemically modified at least one first portion of the first resist material, the chemically modified outer portion of the at least one second portion of the first resist material, and the exposed at least one portion of the second resist material comprises developing the chemically modified at least one first portion of the first resist material, the chemically modified outer portion of the at least one second portion of the first resist material, and the exposed at least one portion of the second resist material in a developer solution selected from the group consisting of tetramethylammonium hydroxide, tetrabutylammonium hydroxide, an alkaline developer, and methyl isobutyl ketone.

17. The method of claim 14, wherein the diffusing the chemically active species into substantially all of the at least one first portion of the first resist material and the diffusing the chemically active species into the outer portion of the at least one second portion of the first resist material to form the chemically modified outer portion of the at least one second portion of the first resist material while leaving the inner portion of the at least one second portion of the first resist material chemically unmodified comprise diffusing an acid into the at least one first portion of the first resist material and into the outer portion of the at least one second portion of the first resist material.

18. The method of claim 17, wherein the diffusing the acid into the at least one first portion of the first resist material and into the outer portion of the at least one second portion of the first resist material comprises subjecting the semiconductor device structure to a temperature of between about 80° C. and about 130° C. for a time of between about 0.5 minute and about 3 minutes.

19. A method of forming a semiconductor device, comprising:
- forming a first resist material in a pattern over an array region of a substrate, the first resist material comprising inner portions insoluble in a developer solution and exposed outer portions soluble in the developer solution;
- forming a second resist material comprising a photosensitive material over the array region of the substrate and in trenches between the exposed outer portions of the first resist material;
- exposing at least some of the inner portions of the first resist material through at least some of the exposed outer portions of the first resist material to radiation sufficient to cause the exposed inner portions of the first resist material to become soluble in the developer solution;
- exposing portions of the second resist material over the array region to the radiation sufficient to cause the exposed portions of the second resist material to become soluble in the developer solution; and
- developing the exposed outer portions of the first resist material, the exposed inner portions of the first resist material, and the exposed portions of the second resist material in the developer solution to remove the exposed outer portions of the first resist material, the exposed inner portions of the first resist material, and the exposed portions of the second resist material.

20. The method of claim 19, further comprising chemically modifying the exposed outer portions of the first resist material with a chemically active species to cause the exposed outer portions of the first resist material to become soluble in the developer solution.

21. The method of claim 19, further comprising forming features in the substrate underlying remaining portions of the first resist material and remaining portions of the second resist material after developing the exposed outer portions of the first resist material, the exposed inner portions of the first resist material, and the exposed portions of the second resist material.

22. The method of claim 21, wherein the forming the features comprises forming at least one of metal lines and metal pads.

23. The method of claim 19, wherein the exposing at least some of the inner portions of the first resist material through at least some of the exposed outer portions of the first resist material to the radiation sufficient to cause the exposed inner portions of the first resist material to become soluble in the developer solution and the developing the exposed outer portions of the first resist material comprises forming gaps between unexposed inner portions of the first resist material to isolate the unexposed inner portions of the first resist material from each other.

24. The method of claim 19, wherein the exposing the portions of the second resist material over the array region to the radiation sufficient to cause the exposed portions of the second resist material to become soluble in the developer solution and the developing the exposed portions of the second resist material comprises forming gaps between unexposed portions of the second resist material to isolate the unexposed portions of the second resist material from each other.

25. The method of claim 19, wherein the forming the first resist material comprises forming a chemically amplified resist material.

* * * * *

UNITED STATES PATENT AND TRADEMARK OFFICE
CERTIFICATE OF CORRECTION

PATENT NO. : 9,213,239 B2  
APPLICATION NO. : 13/746543  
DATED : December 15, 2015  
INVENTOR(S) : Scott Light et al.

Page 1 of 1

It is certified that error appears in the above-identified patent and that said Letters Patent is hereby corrected as shown below:

In the specification:

| | | |
|---|---|---|
| COLUMN 1, | LINE 51, | change "to faint features" to --to form features-- |
| COLUMN 3, | LINE 66, | change "not foam a" to --not form a-- |
| COLUMN 4, | LINE 32, | change "include faulting a" to --include forming a-- |
| COLUMN 11, | LINE 13, | change "device foamed from" to --device formed from-- |
| COLUMN 11, | LINE 67, | change "FIG. 1A" to --FIGS. 1A-- |
| COLUMN 12, | LINE 12, | change "FIG. 1A" to --FIGS. 1A-- |

Signed and Sealed this  
Twelfth Day of April, 2016

Michelle K. Lee  
*Director of the United States Patent and Trademark Office*